United States Patent [19]

Jang et al.

[11] Patent Number: 5,348,896
[45] Date of Patent: Sep. 20, 1994

[54] METHOD FOR FABRICATING A BICMOS DEVICE

[75] Inventors: Wen-Yueh Jang; Wen-Chung Ko, both of Hsinchu, Taiwan

[73] Assignee: Winbond Electronic Corp., Hsinchu, Taiwan

[21] Appl. No.: 128,380

[22] Filed: Sep. 28, 1993

Related U.S. Application Data

[63] Continuation-in-part of Ser. No. 982,452, Nov. 27, 1992, abandoned.

[51] Int. Cl.$^5$ .......................................... H01L 21/265
[52] U.S. Cl. ....................................... 437/31; 437/59; 437/28; 437/162; 148/DIG. 9
[58] Field of Search ................ 437/31, 59, 28, 162; 148/DIG. 9

[56] References Cited

U.S. PATENT DOCUMENTS

| | | | |
|---|---|---|---|
| 4,745,080 | 5/1988 | Scovell et al. | 437/31 |
| 4,746,623 | 5/1988 | Lane | 437/28 |
| 4,912,055 | 3/1990 | Min et al. | 437/31 |
| 4,968,635 | 11/1990 | Hamasaki | 437/31 |
| 5,013,671 | 5/1991 | Havemann | 437/31 |
| 5,023,193 | 6/1991 | Manoliu et al. | 437/31 |
| 5,089,429 | 2/1992 | Hsu | 437/31 |
| 5,196,356 | 3/1993 | Won et al. | 437/59 |
| 5,198,374 | 3/1993 | Kato | 437/59 |
| 5,290,714 | 3/1994 | Onozawa | 148/DIG. 9 |

Primary Examiner—Tom Thomas
Assistant Examiner—Tuan Nguyen
Attorney, Agent, or Firm—Harness, Dickey & Pierce

[57] ABSTRACT

A method for fabricating simultaneously bipolar and complementary MOS transistors is disclosed. After a gate oxide layer for the MOS transistors is grown, the gate oxide layer is etched to expose an intrinsic base region on a bipolar transistor well and to reduce thicknesses of opposite portions of base oxide layers that face one another on two sides of the intransic base region. Impurity is implanted into the intrinsic base region so as to form an intrinsic base of the bipolar transistor, the intrinsic base having a base portion between the base oxide layers and a base link portion connected to the base portion and disposed underneath the opposite portions of the base oxide layers. A polysilicon layer is then deposited on the gate oxide layer, and an impurity is implanted into the polysilicon layer and is driven through the polysilicon layer by high temperature treatment to form an emitter region on the surface of the base portion of the intransic base. An extrinsic base around the base link portion of the intrinsic base is formed during the formation of the sources and drains of the NMOS and PMOS transistors.

4 Claims, 7 Drawing Sheets

METHOD FOR FABRICATING A BICMOS DEVICE

This is a continuation-in-part application of U.S. Pat. application Ser. No. 07/982,452, filed Nov. 27, 1992, now abandoned.

BACKGROUND OF THE INVENTION

1. Field of the Invention

The invention relates to a method for fabricating a BiCMOS device, more particularly to a method for fabricating a BiCMOS device in which the process steps involved with the formation of a base region of a bipolar transistor of the BiCMOS device are modified so as to attain better bipolar transistor characteristics.

2. Description of the Related Art

BiCMOS devices are devices which employ both bipolar and CMOS transistors in the same integrated circuit. Conventionally, BiCMOS devices are formed by forming the bipolar and MOS transistors in selected areas of the device and interconnecting the two types of transistors. This often results in a relatively complicated fabrication process because of the large number of process steps involved.

U.S. Pat. No. 5,013,671 (Havemann) discloses a method for manufacturing simultaneously both types of transistors while minimizing the number of process steps involved. In the above cited patent, a bipolar base region of a bipolar transistor is defined with the use of a masking layer. The masking layer exposes the intrinsic portion of the bipolar base region and does not mask a small tab region adjacent to the intrinsic region. A relatively thick base oxide layer is grown over the intrinsic base and tab regions, and the base dopant is implanted through the base oxide layer. An emitter region of the bipolar transistor may be formed from a doped polysilicon layer on the intrinsic base. When spacers are formed on each side of the polysilicon emitter of the bipolar transistor, the thickness of base oxide at the tab region is decreased. An extrinsic base and an overlap region are formed simultaneous with the formation of the source/drain of one of the MOS transistors of the BiCMOS device and have dopant concentrations which are higher than that of the intrinsic base.

A main drawback of the method described in the above mentioned patent is that control of the base profile of the bipolar transistor is difficult to achieve because the base dopant is implanted through the thick base oxide layer, and further because the base dopant implant step is followed by a thermal cycle for a gate oxide of the MOS transistors.

SUMMARY OF THE INVENTION

Therefore, the objective of the present invention is to provide a method for fabricating a BiCMOS device, which method is capable of overcoming the drawback associated with the above-described prior art.

More specifically, the objective of the present invention is to provide a method for fabricating a BiCMOS device in which the process steps involved with the formation of a base region of a bipolar transistor of the BiCMOS device is modified so as to attain better bipolar transistor characteristics.

Accordingly, the method of the present invention is used in the fabrication of a BiCMOS device with a bipolar transistor and NMOS and PMOS transistors, and comprises the steps of:

(a) implanting first and second conductivity-type impurity into a substrate to form adjacent first, second and third buried regions therein;

(b) depositing an epitaxial layer over the substrate after the first, second and third buried regions have been formed;

(c) implanting first and second conductivity-type impurity into the epitaxial layer at regions overlying the first, second and third buried regions to form a bipolar transistor well, an NMOS transistor well and a PMOS transistor well, one of the NMOS and PMOS transistor wells being disposed between the bipolar transistor well and the other one of the NMOS and PMOS transistor wells;

(d) growing a silicon dioxide layer over surfaces of the bipolar, NMOS and PMOS transistor wells;

(e) depositing a silicon nitride layer on the silicon dioxide layer;

(f) etching the silicon nitride layer in order to expose first isolation regions overlying junctions of the bipolar, NMOS and PMOS transistor wells, and a second isolation region on the surface of the bipolar transistor well adjacent to one of the first isolation regions;

(g) growing field oxide layers on the first and second isolation regions;

(h) etching the silicon nitride layer to expose adjacent base oxide regions on the surface of the bipolar transistor well;

(i) growing base oxide layers on the base oxide regions to define range of an emitter of the bipolar transistor;

(j) removing the silicon nitride layer and the silicon dioxide layer;

(k) forming a sacrificial oxide layer over the bipolar, NMOS and PMOS transistor wells;

(l) forming a deep collector contact of the bipolar transistor in the bipolar transistor well between the second isolation region and the adjacent one of the first isolation regions;

(m) stripping the sacrificial oxide layer;

(n) growing a gate oxide layer overlying the surfaces of the bipolar, NMOS and PMOS transistor wells;

(o) etching the gate oxide layer to expose an intrinsic base region between the base oxide layers on the bipolar transistor well and to reduce thicknesses of opposite portions of the base oxide layers that face one another;

(p) implanting an impurity into the intrinsic base region so as to form an intrinsic base of the bipolar transistor, the intrinsic base having a base portion between the base oxide layers and a base link portion connected to the base portion and disposed underneath the opposite portions of the base oxide layers;

(q) depositing a polysilicon layer on the gate oxide layer;

(r) implanting an impurity into the polysilicon layer, and driving in the impurity in the polysilicon layer by high temperature treatment to enable the impurity to diffuse through the polysilicon layer to form an emitter region on the surface of the base portion of the intrinsic base;

(s) etching the polysilicon layer to form gate electrodes for the NMOS and PMOS transistors and a polysilicon emitter of the bipolar transistor;

(t) subjecting the NMOS transistor well to N-LDD ion implantation, and subjecting the PMOS transistor well to P-LDD implantation, the bipolar transistor well being subjected simultaneously to one of the N-LDD and P-LDD ion implantations;

(u) depositing an oxide layer over the bipolar, NMOS and PMOS transistor wells after the N-LDD and P-LDD ion implantations;

(v) anistropic etching of the oxide layer to form an LDD spacer on each side of the gate electrodes and the polysilicon emitter; and (w) implanting first and second conductivity-type impurity into the bipolar, NMOS and PMOS transistor wells to form source and drain of the NMOS transistor, source and drain of the PMOS transistor, and an extrinsic base of the bipolar transistor around the base link portion of the intrinsic base.

BRIEF DESCRIPTION OF THE DRAWINGS

Other features and advantages of the present invention will become apparent in the following detailed description of the preferred embodiment, with reference to the accompanying drawings, of which.

DETAILED DESCRIPTION OF THE PREFERRED EMBODIMENT

Figure 1:
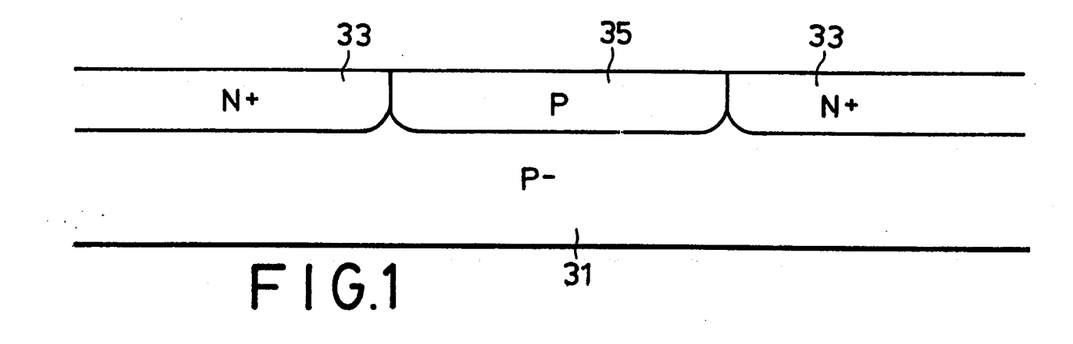
FIGS. 1 to 14 illustrate the preferred embodiment of a method for fabricating a BiCMOS device in accordance with this invention.
Figure 2:
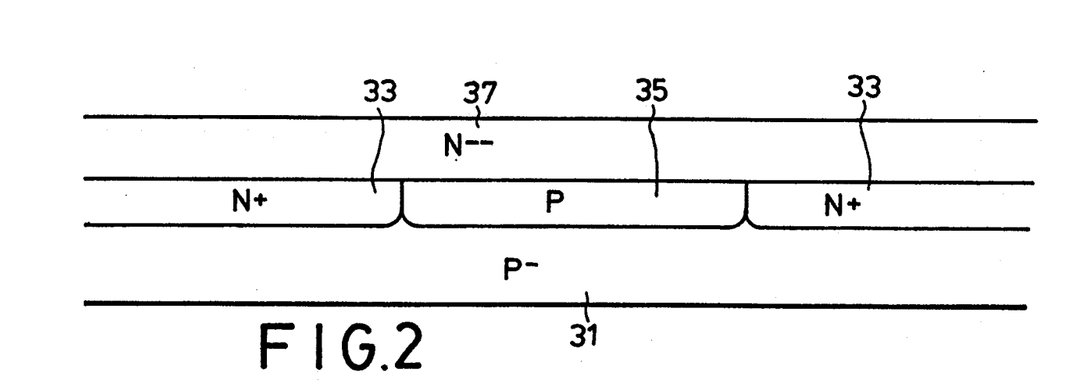
Figure 3:
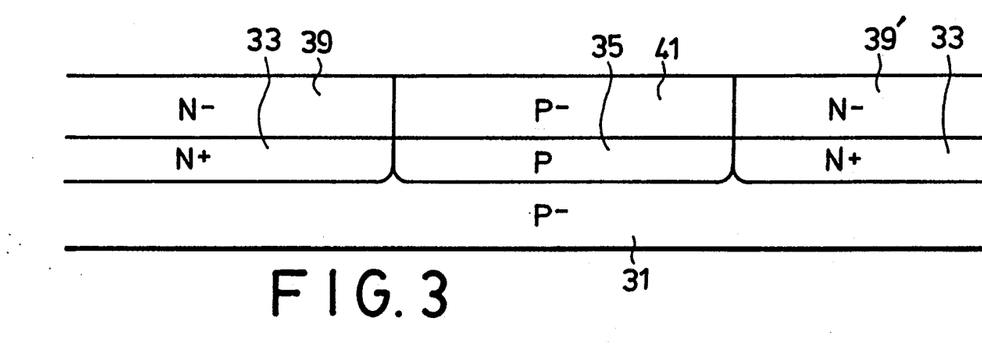

Referring to FIG. 1, buried N+ regions 33 are implanted in a lightly doped P-type semiconductor substrate 31 by a conventional ion implantation method. A buried P region 35 is then implanted in the substrate 31 adjacent to and self-aligned with the buried N+ regions 33. Subsequent to the formation of the buried regions 33, 35, an epitaxial layer 37 is deposited according to well known techniques, as shown in FIG. 2. In this embodiment, the epitaxial layer 37 is a very lightly doped N type material, although a very lightly doped P type material can also be used. N-type bipolar and PMOS transistor wells 39, 39' and a P-type NMOS transistor well 41, which is adjacent to and self-aligned with the N-type bipolar and PMOS transistor wells 39, 39', are formed in the epitaxial layer 37 by known methods, as shown in FIG. 3.

Figure 4:
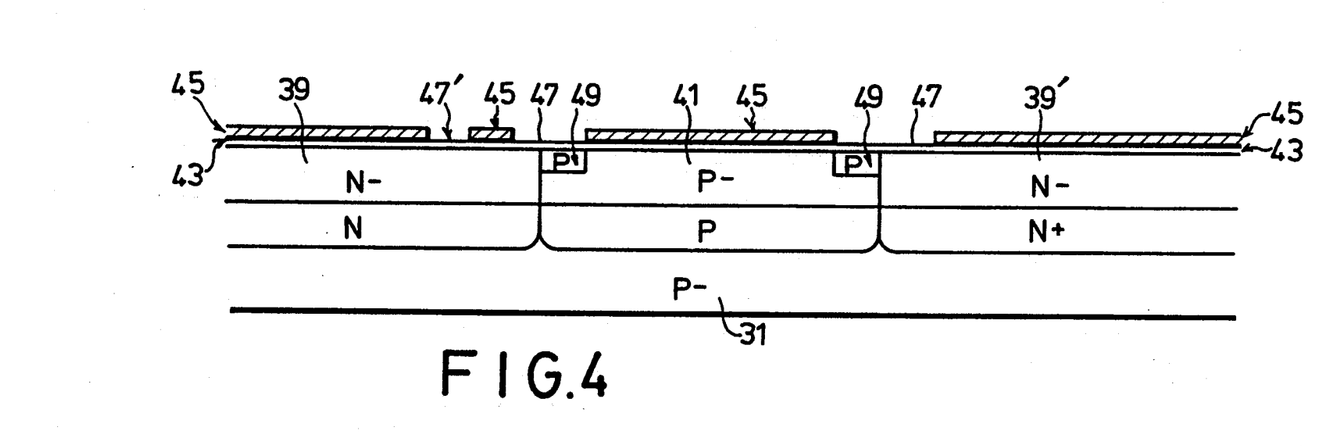
Figure 5:
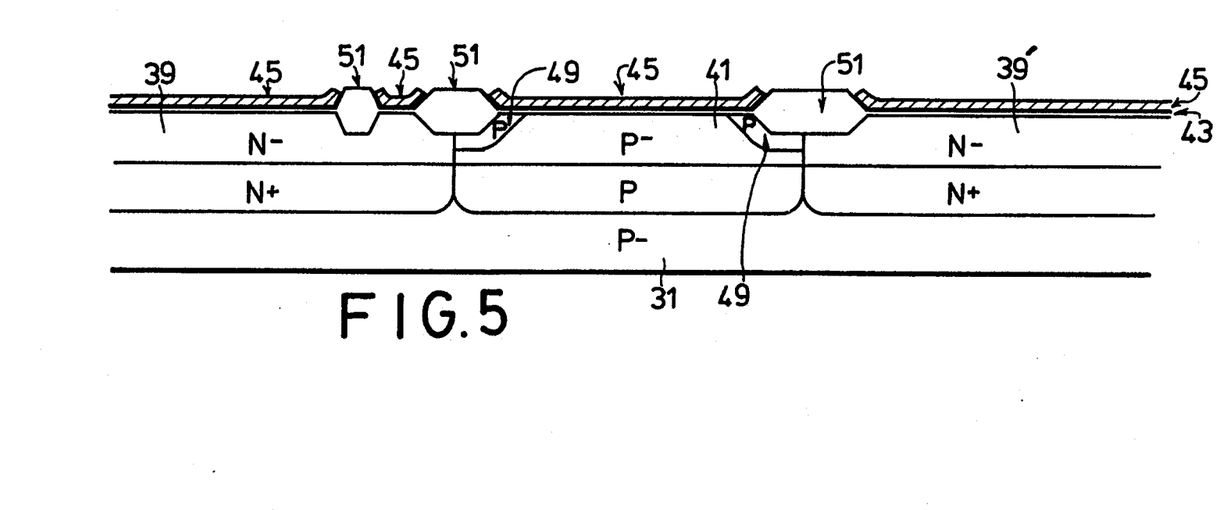

A silicon dioxide layer 43 is grown after the N-type and P-type transistor wells 39, 39', 41 have been implanted, as shown in FIG. 4. A silicon nitride layer 45 is then deposited on the silicon dioxide layer 43 by means of a chemical vapor deposition (CVD) method. A first mask (not shown) is used when etching the silicon nitride layer 45 in order to expose first isolation regions 47 on the junctions of the N-type and P-type transistor wells 39, 39', 41, and a second isolation region 47' on the surface of the N-type bipolar transistor well 39 adjacent to one of the first isolation regions 47. A second mask (not shown) is used to expose field implant regions on the surface of the P-type transistor well 41 adjacent to the N-type transistor wells 39, 39'. Boron field implantations 49 are formed in the field implant regions of the P-type transistor well 41. Field oxide layers 51 are then grown on the first and second isolation regions 47, 47' by means of a known insulating method, such as LOCOS (local oxidation on silicon), as shown in FIG. 5.

Figure 6:
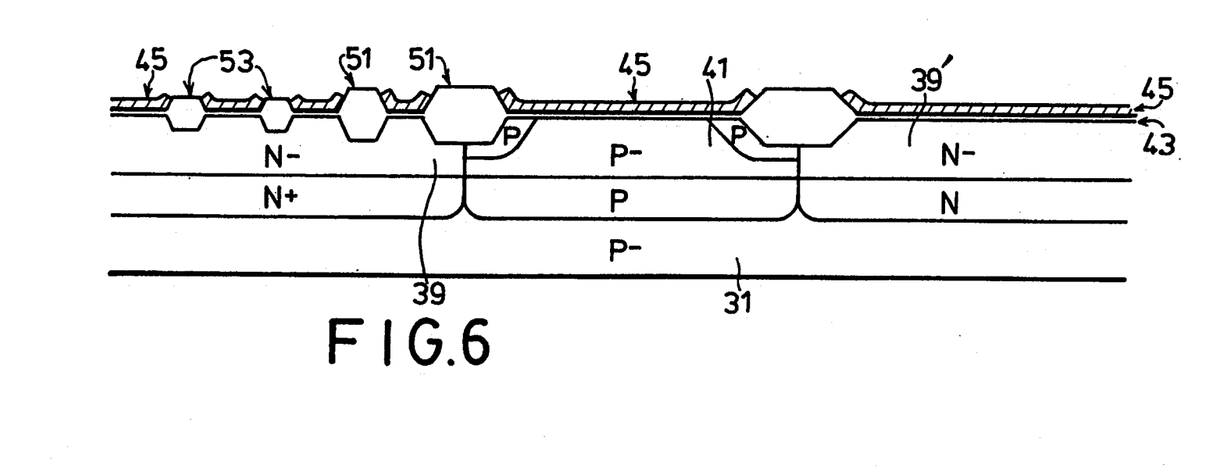

Referring to FIG. 6, the silicon nitride layer 45 is etched to expose adjacent base oxide regions on the surface of the N-type bipolar transistor well 39 with the use of another mask (not shown). Base oxide layers 53 are then grown on the base oxide regions to define the range of an emitter of the bipolar transistor. The method for growing the base oxide layers 53 is similar to that for growing the field oxide layers 51 and will not be detailed further.

Figure 7:
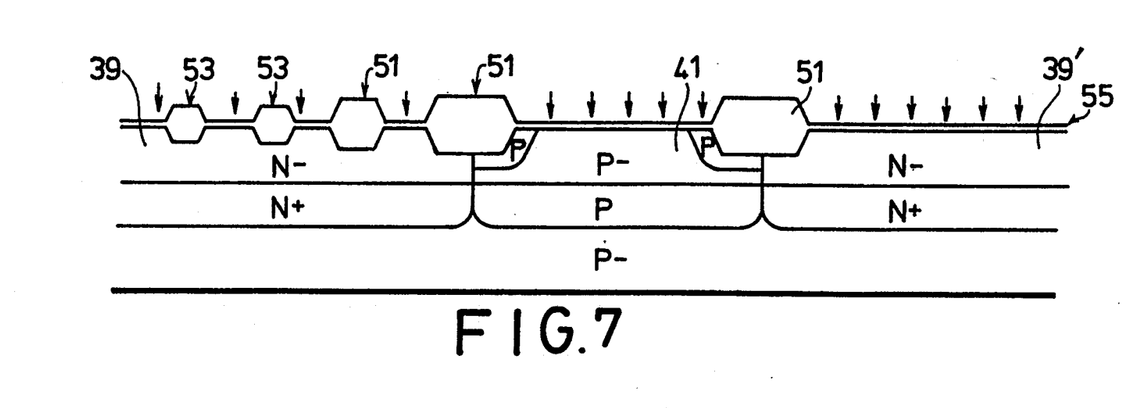

Referring to FIG. 7, the silicon nitride layer 45 and the silicon dioxide layer 43 below the silicon nitride layer 45 are removed according to conventional techniques, and a sacrificial oxide layer 55 is formed. Boron ions are implanted into the sacrificial oxide layer 55 in order to adjust the threshold voltages of the NMOS and PMOS transistors that are to be formed.

Figure 8:
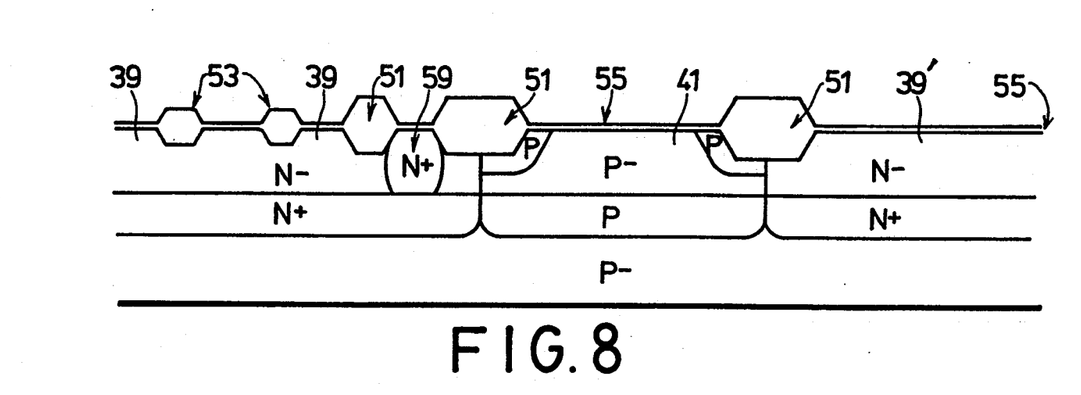

Referring to FIG. 8, an N+ deep collector contact 59 of the bipolar transistor is formed in the N-type bipolar transistor well 39 by means of a deep collector implant in order to reduce the series resistance at the collector of the bipolar transistor. The deep collector contact 59 is formed between the field oxide layers 51 on the surface of the bipolar transistor well 39.

Figure 9:
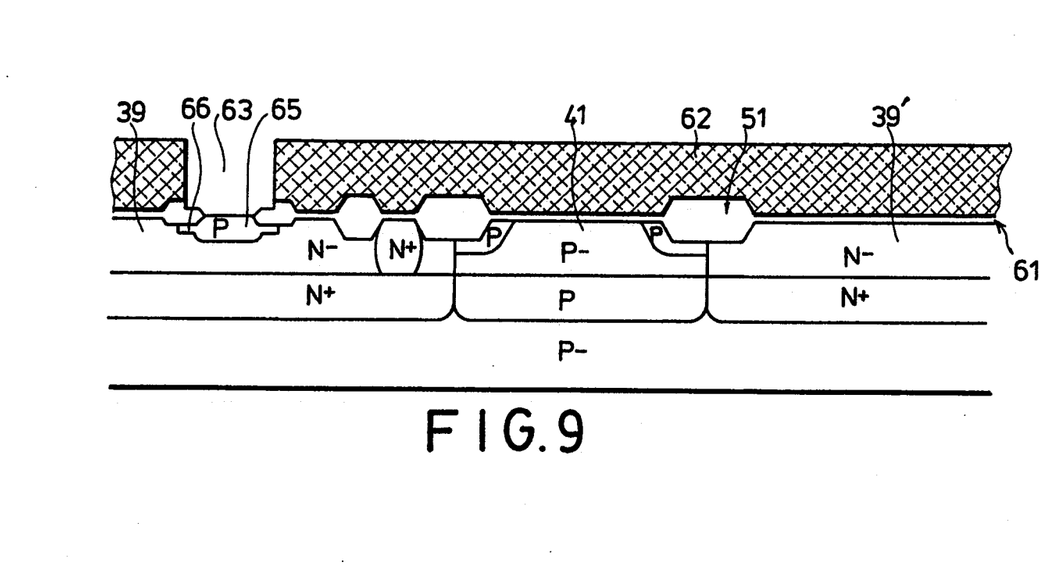

Referring to FIG. 9, the sacrificial oxide layer 55 is stripped, and a gate oxide layer 61 for the NMOS and PMOS transistors is grown. A photoresist layer 62 is used to etch the gate oxide layer 61 in order to expose an intrinsic base region 63 between the base oxide layers 53 on the bipolar transistor well 39, thereby etching off the part of the oxide layer 61 between the base oxide layers 53 and, at the same time, reducing the thicknesses of opposite portions of the base oxide layers 53 that face one another. Boron ions are then implanted into the intrinsic base region 63 so as to form a P-type intrinsic base of the bipolar transistor with a base portion 65 between the base oxide layers 53 and a base link portion 66 connected to the base portion 65 and disposed underneath the thinned opposite portions of the base oxide layers 53.

Figure 10:
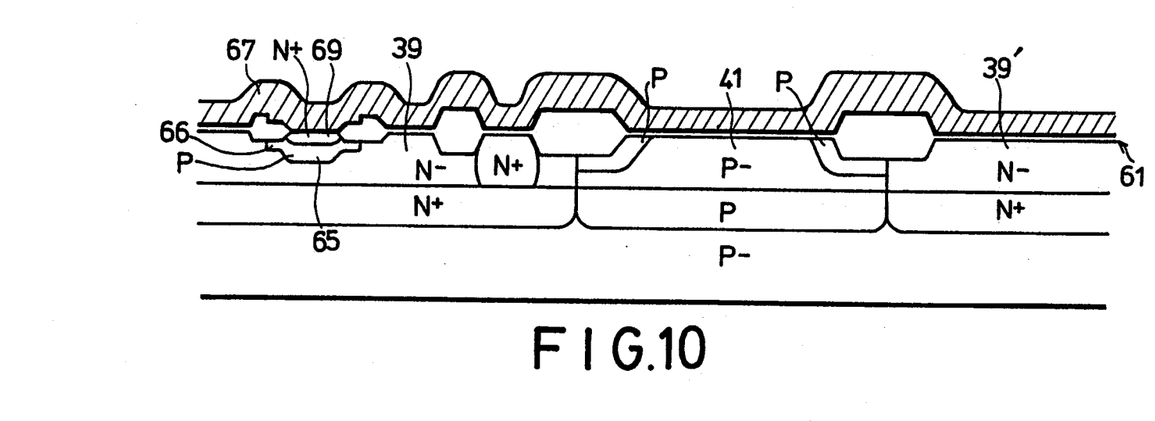

Referring to FIG. 10, a polysilicon layer 67 is then deposited on the gate oxide layer 61 and serves as a gate contact for the NMOS and PMOS transistors and as an emitter contact for the bipolar transistor. The polysilicon layer 67 is implanted with phosphorous or arsenic ions in order to dope the same into N+. the ions are driven in by means of a known high temperature treatment, thereby enabling the ions to diffuse through the polysilicon layer 67 and form an N+ emitter region 69 of the bipolar transistor on the surface of the base portion 65.

Figure 11:
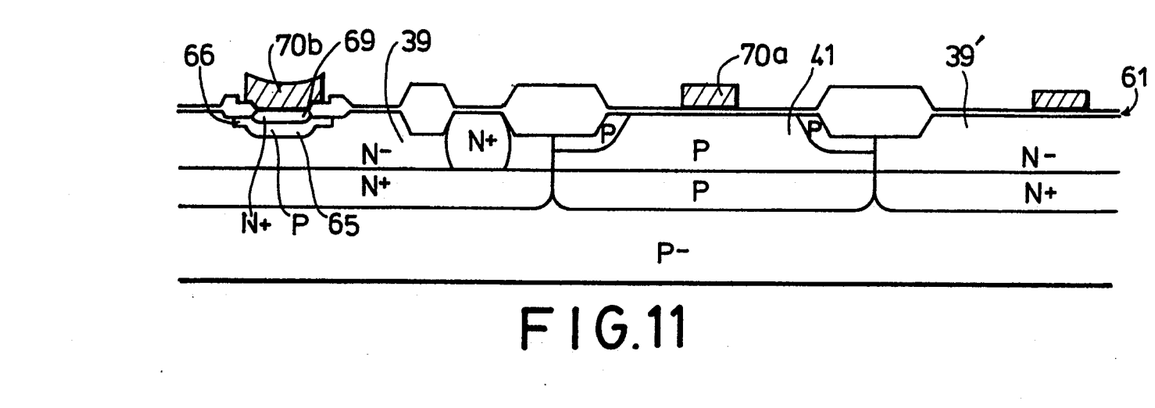
Figure 12:
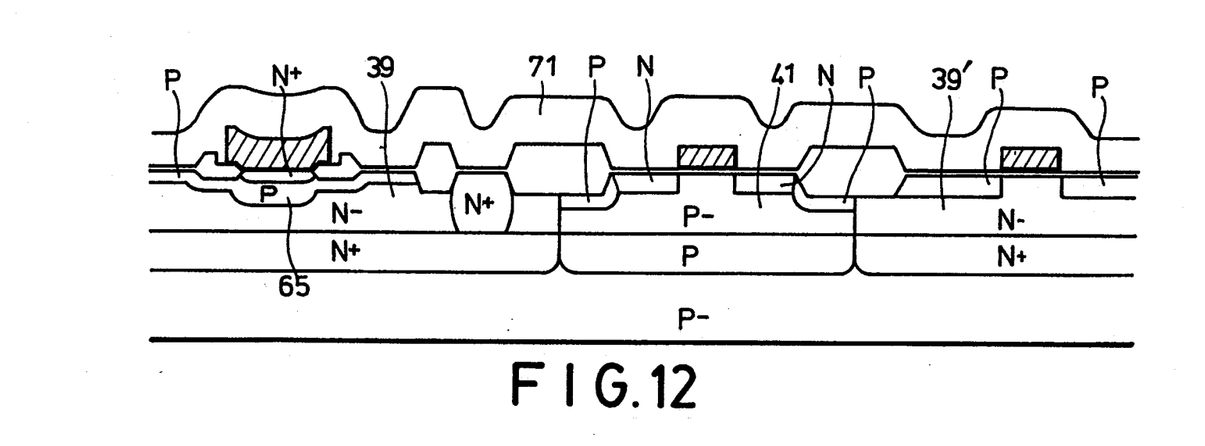

Referring to FIG. 11, the polysilicon layer 67 is etched to form gate electrodes 70a for the MOSFET transistors and a polysilicon emitter 70b of the bipolar transistor. Subsequently, ion implantation of N-LDD (lightly-doped drain) and P-LDD are performed in a conventional manner so as to initiate the formation of the source and drains of the NMOS and PMOS transistors. The NMOS transistor well 41 is subjected to N-LDD ion implantation, while the bipolar and PMOS transistor wells 39, 39' are simutaneously subjected to P-LDD implantation, as shown in FIG. 12. Alternatively, it is also possible to subject only the NMOS transistor well to N-LDD ion implantation. An oxide layer 71 is then deposited in preparation for the formation of LDD spacers.

Figure 13:
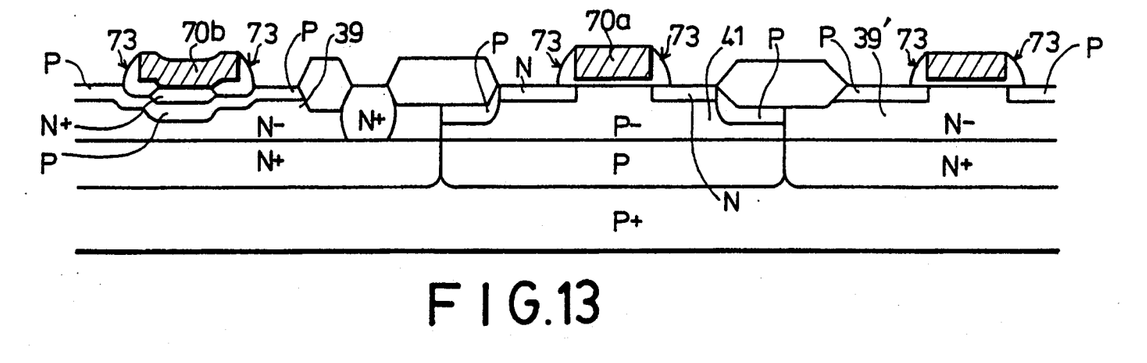

Referring to FIG. 13, anistropic etching of the oxide layer 71 is performed so as to form an LDD spacer 73 on each side of the gate electrodes 70a and the polysilicon emitter 70b. Over etching is required in order to ensure precise formation of the LDD spacers 73, thereby removing at the same time the base oxide layers at the polysilicon emitter 70b.

Figure 14:
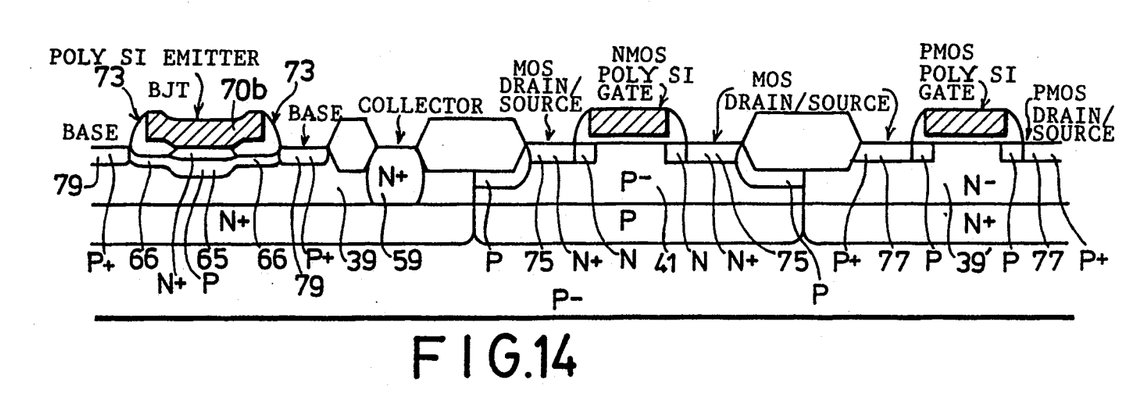

The succeeding process steps are generally similar to those employed in a conventional CMOS fabricating process. Referring to FIG. 14, these process steps include: exposure of N+ implant regions of he NMOS transistor well 41 by means of an N+ mask (not shown); N+ ion implantation into the N+ implant regions to form the NMOS source and drains 75; exposure of P+ implant regions of the PMOS transistor well 39' by means of a P+ mask (not shown); and P+ ion implantation into the P+ implant regions to form the PMOS source and drains 77. The area around the LDD spacers 73 of the polysilicon emitter 70b is also implanted with P+ ions, thereby forming a P+ extrinsic base 79 around the base link portion 66.

To complete the BiCMOS device, an insulating oxide layer and a boron phosphorous silicon glass (BPSG) are deposited on the whole surface of the fabricated structure for electrical insulation and surface flattening purposes. The terminals of the bipolar and MOS transistors are then exposed by forming contact holes through the insulating oxide layer and the BPSG layer in order to permit connection with metal wires. A passivation step is then conducted to form a protective layer to protect the fabricated structure. The protective layer is the provided with windows for wire-connection purposes during the packaging stage of the BiCMOS device.

Because some of the latter steps of the BiCMOS fabricating process involve heat treatment, the extrinsic base 79 diffuses laterally and connects with the base link portion 66. Therefore, the base resistance will be dramatically reduced, and the performance of the bipolar transistor will be enhanced.

Note that the above disclosed steps recite the fabrication of a BiCMOS device with an NPN bipolar transistor. If a BiCMOS device with a PNP bipolar transistor is to be fabricated, the PNP transistor is fabricated in a P-type well instead of an N-type well, and phosphorous or arsenic ions are implanted in the intrinsic and extrinsic bases. In addition, the step of doping the polysilicon layer is further replaced with a boron ion implant step.

Note that in the present invention, the extrinsic base 79 is initially formed by doping through the thin gate oxide layer 61. Therefore, unlike the method described in U.S. Pat. No. 5,013,671, control of the base profile of the bipolar transistor is easier to achieve because the base dopant implant step is done after a thermal cycle for the gate oxide 61.

Other advantages arising from the use of the method of the present invention are as follows:

1. No additional implant step is required to form the base link portion. The base region and the base link region of the intrinsic base are connected directly to each other, thereby resulting in a lower base resistance.

2. The pn and p+n junction depths are relatively shallow, thereby permitting a reduction in the vertical thickness of the fabricated device.

3. The distance between the extrinsic base and the emitter-base contact face is larger than that of conventional BiCMOS devices. Therefore, problems relating to current leakage and reliability can be prevented.

4. The extrinsic base will not diffuse into the base portion of the intrinsic base, thereby preventing a reduction in current gain.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

WE CLAIM:

1. A method for fabricating a BiCMOS device with a bipolar transistor and NMOS and PMOS transistors, said method comprising the steps of:
   (a) implanting first and second conductivity-type impurity into a substrate to form adjacent first, second and third buried regions therein;
   (b) depositing an epitaxial layer over the substrate after the first, second and third buried regions have been formed;
   (c) implanting first and second conductivity-type impurity into the epitaxial layer at regions overlying the first, second and third buried regions to form a bipolar transistor well, an NMOS transistor well and a PMOS transistor well, one of the NMOS and PMOS transistor wells being disposed between the bipolar transistor well and the other one of the NMOS and PMOS transistor wells;
   (d) growing a silicon dioxide layer over surfaces of the bipolar, NMOS and PMOS transistor wells;
   (e) depositing a silicon nitride layer on the silicon dioxide layer;
   (f) etching the silicon nitride layer in order to expose first isolation regions overlying junctions of the bipolar, NMOS and PMOS transistor wells, and a second isolation region on the surface of the bipolar transistor well adjacent to one of the first isolation regions;
   (g) growing field oxide layers on the first and second isolation regions;
   (h) etching the silicon nitride layer to expose adjacent base oxide regions on the surface of the bipolar transistor well;
   (i) growing base oxide layers on the base oxide regions to define range of an emitter of the bipolar transistor;
   (j) removing the silicon nitride layer and the silicon dioxide layer;
   (k) forming a sacrificial oxide layer over the bipolar, NMOS and PMOS transistor wells;
   (l) forming a deep collector contact of the bipolar transistor in the bipolar transistor well between the second isolation region and the adjacent one of the first isolation regions;
   (m) stripping the sacrificial oxide layer;
   (n) growing a gate oxide layer overlying the surfaces of the bipolar, NMOS and PMOS transistor wells;
   (o) etching the gate oxide layer to expose an intrinsic base region between the base oxide layers on the bipolar transistor well and to reduce thicknesses of opposite portions of the base oxide layers that face one another;
   (p) implanting an impurity into the intrinsic base region so as to form an intrinsic base of the bipolar transistor, the intrinsic base having a base portion between the base oxide layers and a base link portion connected to the base portion and disposed underneath the opposite portions of the base oxide layers;
   (q) depositing a polysilicon layer on the gate oxide layer, and on the intrinsic base region;
   (r) implanting an impurity into the polysilicon layer, and driving in the impurity in the polysilicon layer by high temperature treatment to enable the impurity to diffuse through the polysilicon layer to form an emitter region on the surface of the base portion of the intrinsic base.

2. The method as claimed in claim 1, further comprising the steps, after step (r):
- (s) etching the polysilicon layer to form gate electrodes for the NMOS and PMOS transistors and a polysilicon emitter of the bipolar transistor;
- (t) subjecting the NMOS transistor well to N-LDD ion implantation, and subjecting the PMOS transistor well to P-LDD implantation, the bipolar transistor well being subjected simultaneously to one of the N-LDD and P-LDD ion implantations;
- (u) depositing an oxide layer over the bipolar, NMOS and PMOS transistor wells after the N-LDD and P-LDD ion implantations;
- (v) anistropic etching of the oxide layer to form an LDD spacer on each side of the gate electrodes and the polysilicon emitter; and
- (w) implanting first and second conductivity-type impurity into the bipolar, NMOS and PMOS transistor wells to form source and drain of the NMOS transistor, source and drain of the PMOS transistor, and an extrinsic base of the bipolar transistor around the base link portion of the intrinsic base.

3. The method as claimed in claim 1, further comprising the steps, between steps (f) and (g):
- (f1) etching the silicon nitride layer in order to expose field implant regions on the surface of said one of the NMOS and PMOS transistor wells; and
- (f2) forming boron field implantations in the field implant regions.

4. The method as claimed in claim 1, further comprising, between steps (k) and (l), the step of implanting an impurity into the sacrificial oxide layer to adjust threshold voltages of the NMOS and PMOS transistors to be formed.

* * * * *